(12) United States Patent
Emira et al.

(10) Patent No.: US 11,870,396 B2
(45) Date of Patent: Jan. 9, 2024

(54) OPEN-LOOP VALLEY REGULATION FOR SUPPLY VOLTAGE MODULATION IN POWER AMPLIFIER CIRCUITS

(71) Applicant: Shenzhen Goodix Technology Co., Ltd., Shenzhen (CN)

(72) Inventors: Ahmed Emira, San Diego, CA (US); Siavash Yazdi, San Diego, CA (US); Kaveh Moazzami, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 33 days.

(21) Appl. No.: 17/522,865

(22) Filed: Nov. 9, 2021

(65) Prior Publication Data

US 2022/0069774 A1 Mar. 3, 2022

Related U.S. Application Data

(63) Continuation-in-part of application No. 16/916,155, filed on Jun. 30, 2020, now Pat. No. 11,190,141, (Continued)

(51) Int. Cl.
| | | |
|---|---|---|
| H03F 3/04 | (2006.01) | |
| H03F 1/02 | (2006.01) | |
| H03B 5/04 | (2006.01) | |
| G01R 19/165 | (2006.01) | |
| G01R 19/14 | (2006.01) | |
| G01R 19/28 | (2006.01) | |
| H03B 5/12 | (2006.01) | |

(52) U.S. Cl.
CPC .......... *H03F 1/0233* (2013.01); *G01R 19/14* (2013.01); *G01R 19/16538* (2013.01); *G01R 19/28* (2013.01); *H03B 5/04* (2013.01); *H03B 5/124* (2013.01)

(58) Field of Classification Search
CPC ............ H03F 1/0233; H03F 2200/324; H03F 2200/451; H03F 3/19; H03F 3/245; H03F 1/0238; H03F 2200/102; G01R 19/14; G01R 19/16538; G01R 19/28; G01R 19/16576; G01R 19/16547; H03C 1/06; H03B 5/04; H03B 5/124
USPC ........................................................ 330/298
See application file for complete search history.

(56) References Cited

U.S. PATENT DOCUMENTS

2012/0223777 A1* 9/2012 Drogi ..................... H03F 3/245
330/297

* cited by examiner

*Primary Examiner* — Andrea Lindgren Baltzell
*Assistant Examiner* — Khiem D Nguyen
(74) *Attorney, Agent, or Firm* — Kilpatrick Townsend & Stockton LLP

(57) ABSTRACT

Techniques are described for using valley detection for supply voltage modulation in power amplifier circuits. Embodiments operate in context of a power amplifier circuit configured to be driven by a supply voltage generated by a supply modulator and to receive an amplitude-modulated (AM) signal at its input. The output of the power amplifier circuit can be fed to a valley detector that can detect a valley level corresponding to the bottom of the envelope of the AM signal. The detected valley level can be fed back to the supply modulator and compared to a constant reference. In response to the comparison, the supply modulator can vary the supply voltage to the power amplifier circuit in a manner that effectively tracking the envelope of the power amplifier circuit's output signal, thereby effectively seeking a flat valley for the output signal's envelope.

19 Claims, 10 Drawing Sheets

Related U.S. Application Data which is a continuation of application No. 16/000,952, filed on Jun. 6, 2018, now Pat. No. 10,763,790.

OPEN-LOOP VALLEY REGULATION FOR SUPPLY VOLTAGE MODULATION IN POWER AMPLIFIER CIRCUITS

CROSS-REFERENCE TO RELATED APPLICATIONS

This application is a continuation in part of U.S. patent application Ser. No. 16,916,155, entitled "VALLEY DETECTION FOR SUPPLY VOLTAGE MODULATION IN POWER AMPLIFIER CIRCUITS," filed Jun. 30, 2020, which is a continuation of U.S. patent application Ser. No. 16/000,952, for "VALLEY DETECTION FOR SUPPLY VOLTAGE MODULATION IN POWER AMPLIFIER CIRCUITS", filed on Jun. 6, 2018, which are hereby incorporated by references in their entireties.

FIELD OF THE INVENTION

The present invention relates generally to power amplifier circuits. More particularly, embodiments of the present invention relate to valley detection for supply voltage modulation in power amplifier circuits.

BACKGROUND OF THE INVENTION

Power amplifier circuits are commonly used in a variety of applications for a number of purposes, including to apply gain to a signal to generate an amplified output signal. In some applications, the power amplifier has a single-ended output, such that a single output signal is generated. In other applications, the power amplifier has a double-ended output, such that differential (e.g., complementary) output signals are generated. In many cases, the power amplifier is driven by a voltage supply generated by a voltage supply circuit.

In many conventional applications, the voltage supply circuit seeks to maintain a constant supply voltage to the power amplifier circuit. As an example, an amplitude-modulated (AM) signal can include a radiofrequency carrier signal modulated by a lower frequency signal that manifests a changing amplitude envelope. When such an AM signal is received by a conventional power amplifier application, maintaining the constant supply voltage to the power amplifier circuit can cause certain inefficiencies, such as power loss when the amplitude envelope is less than the supply voltage.

BRIEF SUMMARY

Embodiments of the present invention provides circuits, devices, and methods for using valley detection for supply voltage modulation in power amplifier circuits. Embodiments operate in context of a power amplifier circuit configured to be driven by a supply voltage generated by a supply modulator and to receive an amplitude-modulated (AM) signal at its input. As used herein, an "amplitude-modulated" signal, or the like, can refer to a context in which supply modulation is used with a linear amplifier (e.g., where the amplitude and phase information are contained in one set of data contained in the signal), in which supply modulation is used with a polar amplifier (e.g., where an amplitude signal and a Phase signal are received separately), or in any other suitable context.

In closed-loop embodiments, the output (or outputs, in some differential cases) of the power amplifier circuit can be fed to a valley detector that can detect a valley level corresponding to the bottom of the envelope of the AM signal. The detected valley level can be fed back to the supply modulator and compared to a constant reference. In response to the comparison, the supply modulator can vary the supply voltage to the power amplifier circuit in a manner that effectively tracking the envelope of the power amplifier circuit's output signal, thereby effectively seeking a flat valley for the output signal's envelope. Some embodiments further detect whether the supply voltage is below a threshold minimum level (e.g., below which there may be insufficient headroom for components of the power amplifier circuit). Such embodiments can selectively track the supply voltage to the power amplifier circuit output envelope only when the supply voltage is above the threshold minimum level, and can allow the supply regulator to maintain a constant supply voltage otherwise.

In open-loop embodiments, valley detection can be used during a calibration phase to determine a compensation value for each of multiple gain settings for the power amplifier. Each compensation value corresponds to a compensated supply voltage level that is calibrated, by the calibration phase, so that applying the respective compensated supply voltage level and the respective gain setting to the power amplifier circuit causes the generated signal output to have an output valley level substantially at a target valley level. The calibration values can be stored to a lookup table. In an operating phase, as the gain setting of the power amplifier changes, the change is detected by a valley compensator. The valley compensator can lookup the corresponding compensation value in the lookup table and output a corresponding compensation signal to the supply modulator, causing the supply modulator to output the supply voltage at the compensated supply voltage level that was calibrated for the current gain setting, and maintaining the output valley level substantially at the target valley level.

According to one set of embodiments, a power amplifier system is provided. The system includes: a supply modulator circuit to generate a supply voltage at a supply output based at least on a valley level input; a power amplifier circuit coupled with the supply output of the supply modulator circuit to receive the supply voltage, having a gain input node to receive a digital amplitude signal, and configured to generate a signal output according to the supply voltage and to one of a plurality of gain settings indicated by the digital amplitude signal; and a valley compensator having a lookup table coupled with the valley level input of the supply modulator and configured to output a compensation signal to the valley level input responsive to receiving the digital amplitude signal, such that the compensation signal indicates one of a plurality of compensation values selected based on a present gain setting of the plurality of gain settings indicated by the digital amplitude signal, wherein each compensation value is stored by the lookup table in association with a respective gain setting one of the plurality of gain settings, and outputting each compensation value to the valley level input directs the supply modulator circuit to output the supply voltage at a respective compensated supply voltage level calibrated, so that applying the respective compensated supply voltage level and the respective gain setting to the power amplifier circuit generates the signal output to have an output valley level substantially at a predetermined target valley level.

According to another set of embodiments, a method is provided for valley compensation in a power amplifier system. The method includes: monitoring a digital amplitude signal to detect a present gain setting of a plurality of gain settings, the digital amplitude signal being used to amplitude modulate a signal output of a power amplifier circuit, the power amplifier circuit generating the signal output according to a supply voltage and to the present gain setting as indicated by the digital amplitude signal; identifying a present compensation value as associated with the present gain setting, the present compensation value being one of a plurality of compensation values, each stored by a lookup table in association with a respective gain setting of the plurality of gain settings, and each corresponding to a respective compensated supply voltage level that is calibrated so that setting the supply voltage to the respective compensated supply voltage level when the present gain setting is set to the respective gain setting causes an output valley level of the signal output generated by the power amplifier circuit to be substantially at a predetermined target valley level; generating a compensation signal based on the present compensation value; and outputting the compensation signal to a supply modulator circuit to generate the supply voltage at the respective compensated supply voltage level corresponding to the present compensation value.

According to another set of embodiments, another method is provided for valley compensation in a power amplifier system. The method includes: generating, for each gain setting of at least a portion of a plurality of gain settings, a respective compensation value of a plurality of compensation values by: setting a digital amplitude signal to indicate the gain setting, the digital amplitude signal coupled with a power amplifier circuit configured to generate a signal output from a signal input such that the signal output has an amplitude based on the gain setting and a common mode based on a supply voltage; detecting a present output valley level of an amplitude envelope of the signal output at the gain setting; computing the respective compensation value for the gain setting based on the detecting the present output valley level, the respective compensation value corresponding to a respective compensated supply voltage level, calibrated such that setting the supply voltage to the respective compensated supply voltage level with the digital amplitude signal set to the gain setting causes an output valley level of the signal output generated by the power amplifier circuit to be substantially at a predetermined target valley level; and storing the respective compensation value in a lookup table in association with the gain setting.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
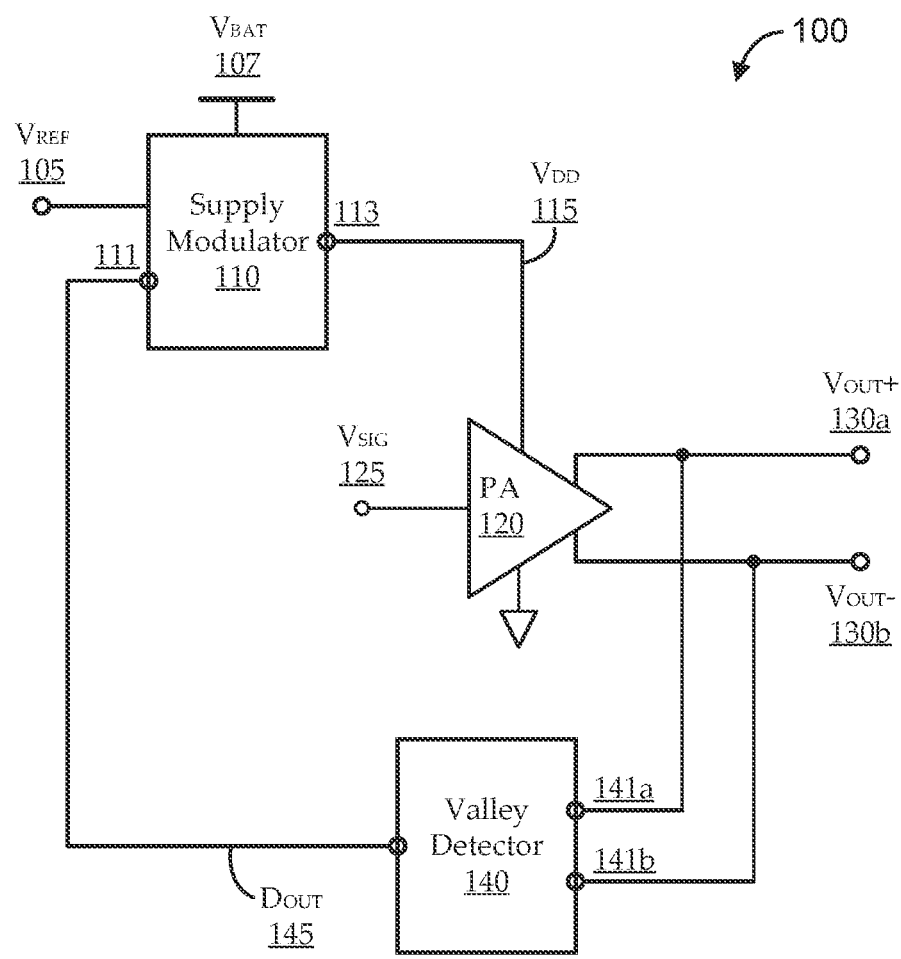
FIG. 1 shows an illustrative power amplifier system, according to various embodiments.

FIG. 1 shows an illustrative power amplifier system 100, according to various embodiments. For the sake of context, power amplifier circuits are commonly used in a variety of applications for a number of purposes, including to apply gain to a signal to generate an amplified output signal. Typically, the power amplifier is driven by a voltage supply generated by a voltage supply circuit. In many conventional implementations, the voltage supply circuit drives the power amplifier circuit with a constant supply voltage.

In many modern electronics applications, the power amplifier circuit is part of a signal communications system. For example, cellular telephones and other devices having wireless communication capabilities include a radio system having receivers and/or transmitters for communicating radiofrequency (RF) signals. Such signals can include an amplitude-modulated (AM) signal (e.g., a signal having only amplitude information, one or more signals having amplitude and phase information, etc.), for which information is encoded by modulating the amplitude (e.g., signal strength) of a signal communicated at a RF carrier frequency (e.g., alone, or in conjunction with, or in addition to, modulating the phase of the signal).

Figure 2:
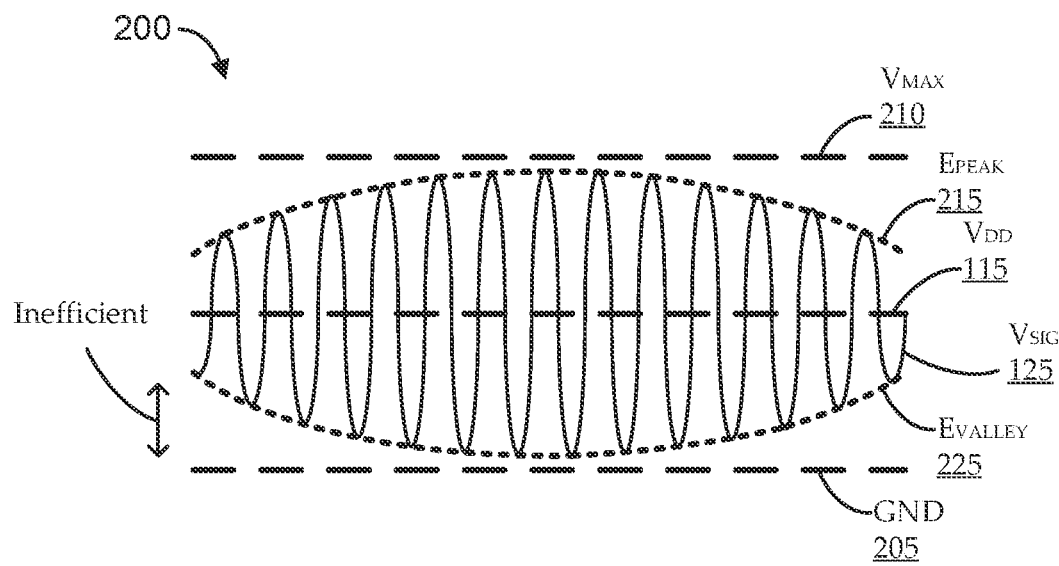
FIG. 2 shows an illustrative waveform of a portion of a radiofrequency (RF) amplitude-modulated (AM) signal.

As an example, FIG. 2 shows an illustrative waveform 200 of a portion of an RF AM signal. As illustrated, the RF signal ($V_{SIG}$) 125 is amplitude modulated, such that its amplitude follows an envelope. Some conventional envelope tracking power amplifiers can seek to provide a substantially constant supply voltage ($V_{DD}$) 115, around which the RF signal 125 is substantially symmetrical. For example, at any particular time, a peak of the envelope ($E_{PEAK}$) 215 and a valley of the envelope ($E_{VALLEY}$) 225 are substantially the same distance from $V_{DD}$ 115 and are between a maximum peak voltage ($V_{MAX}$) 210 and a ground level (GND) 205.

In such cases, driving a power amplifier circuit with a constant supply voltage can be inefficient, particularly for a power amplifier circuits with a high peak-to-average power ratio (PAPR). For example, power efficiency is often an important aspect of signal communications system design, and maintaining a constant supply voltage to the power amplifier circuit in an AM signal context can result in sub-optimal power efficiency (e.g., excessive headroom may be provided to various components when the RF signal envelope has a low amplitude). Accordingly, come conventional power amplifier circuits are configured as envelope tracking systems. In such systems, the supply voltage to the power amplifier circuit can be varied to track the modulated amplitude of the RF signal.

For example, some conventional approaches detect an envelope of the RF signal being input to the power amplifier circuit, estimate the gain expected to be applied to the RF signal by the power amplifier circuit, and adjust the supply voltage (e.g., according to a determined power amplifier gain code, or the like) in an attempt to maintain low headroom over the changing signal amplitude. While such approaches can be effective, their efficiency can often vary with process, voltage, and temperature (PVT) variations, and the like, such as differences in manufacturing tolerances and process variations for power amplifier circuits, power supply circuits, antennas, etc. Accordingly, some state-of-the-art approaches include additional, complex circuitry to mitigate such concerns. For example, some newer approaches rely on determining characteristics of various components during manufacturing, and selecting values in a look-up table (LUT) for setting circuit parameters to match the determined characteristics. Other newer approaches use complex circuitry (detection circuitry, including digital-to-analog converters (DACs), and other components) to characterize components during operation of the circuits and automatically to select values in a LUT for setting circuit parameters to match the determined characteristics.

Embodiments described herein follow a novel approach relying on using valley detection to inform supply voltage modulation in power amplifier circuits. For example, embodiments regulate the supply voltage to the power amplifier circuit by comparing a valley level of the amplitude envelope of the power amplifier's output signal to a constant reference level. This can cause the regulated supply voltage effectively to track the envelope of the output signal, which can substantially flatten out the valley of the envelope. Such an approach provides a number of features. One such feature is that flattening out the valley can tend to avoid inefficiently providing excessive headroom to components of the power amplifier circuit. Another such feature is that the novel approach performs envelope tracking based on the output of the power amplifier circuit, rather than on the input. As such, the detection is substantially agnostic to (e.g., are not impacted by and/or compensate for) PVT variations in the power amplifier circuit.

Returning to FIG. 1, the power amplifier system 100 includes a supply modulator circuit 110, a power amplifier circuit 120, and a valley detector circuit 140. Embodiments of the supply modulator circuit 110 include a reference voltage input 105, a valley level input 111, and a supply output 113 to output a supply voltage ($V_{DD}$) 115. As described below, the supply output 113 is generated as a function of the reference voltage input 105 and the valley level input 111. For example, in some embodiments, the supply modulator circuit 110 includes an operational amplifier having a negative input coupled with the reference voltage input 105, a positive input coupled with the valley level input 111, and an output coupled with the supply output 113.

Embodiments of the power amplifier circuit 120 are coupled with the supply output 113 of the supply modulator circuit 110 to receive the supply voltage 115. The power amplifier circuit 120 is driven by the supply voltage 115, accordingly. The power amplifier circuit 120 has a signal input 125 and a signal output 130. The signal output 130 is generated by applying a gain to the signal input 125 according to the supply voltage 115. In some embodiments, the power amplifier circuit 120 has a double-ended output, such that the signal output 130 includes a first signal output 130*a* and a second signal output 130*b*. For example, the power amplifier circuit 120 can be a differential-output power amplifier, such that the first signal output 130*a* and the second signal output 130*b* are a differential pair (e.g., the output signals at the first and second signal outputs 130 are complementary). While various embodiments are illustrated herein in context of power amplifier circuits 120 having differential outputs, embodiments can be implemented using power amplifier circuits 120 having a single-ended output (i.e., having a single signal output 130). In such embodiments, for example, the valley detector circuit 140 can be coupled with the single signal output 130. In some implementations, the power amplifier circuit 120 is a linear power amplifier. In other implementations, the power amplifier circuit 120 is a polar power amplifier.

Embodiments of the valley detector circuit 140 include a detection input 141 coupled with the signal output 130 of the power amplifier circuit 120. In cases where the power amplifier circuit 120 has multiple (e.g., differential) signal outputs 130, the valley detector circuit 140 can include multiple corresponding detection inputs 141. The valley detector circuit 140 can also include a detection output 145 coupled with the valley level input 111 of the supply modulator circuit 110. The detection output 145 can be generated as a function of the detection input(s) 141 substantially to track a valley level of an amplitude envelope of the signal output 130 of the power amplifier circuit 120. In some implementations, the detection output 145 is the valley level. In other implementations, the detection output 145 is a signal corresponding to (i.e., indicating) the valley level.

Figure 8:
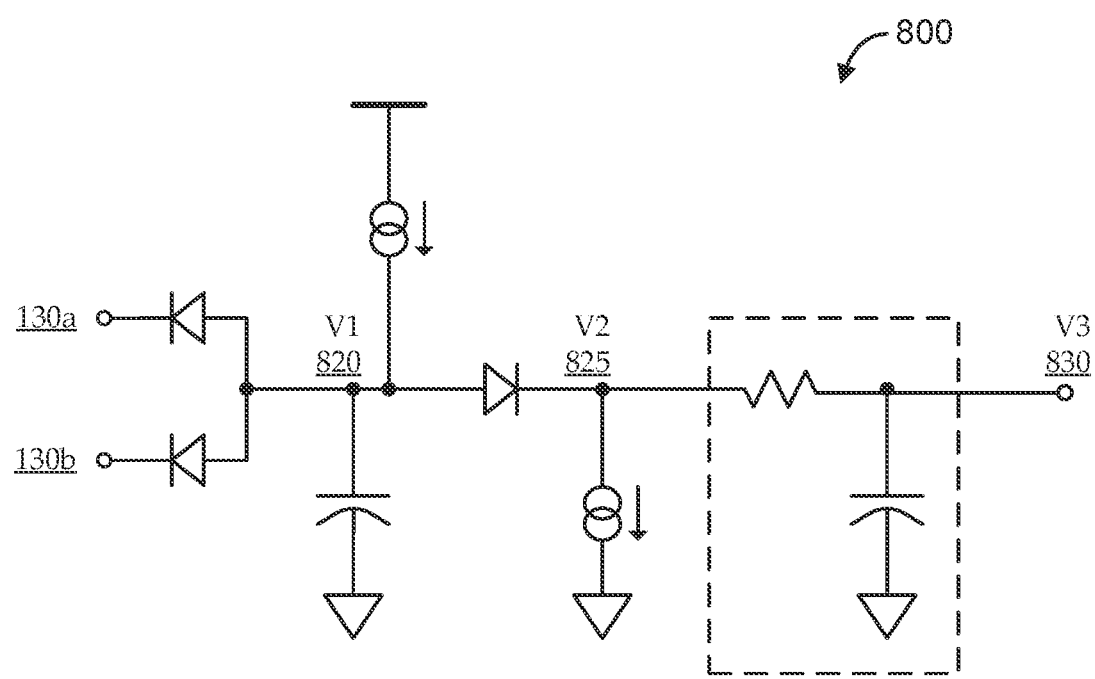
FIG. 8 shows an illustrative valley detector, according to various embodiments.

Some embodiments of the valley detector circuit 140 directly detects the valley level of the amplitude envelope of the signal output 130 of the power amplifier circuit 120. FIG. 8 shows an illustrative valley detector 800, according to various embodiments. The valley detector 800 can be an implementation of valley detector circuit 140 of FIG. 1. As illustrated, the signal output 130 (or signal outputs 130*a* and 130*b*, in differential cases) of the power amplifier circuit 120 are inputs to the valley detector 800. Each input (corresponding to a signal output 130) is coupled across an input diode to a node that is between a current source and a capacitor. Accordingly, that node (the voltage across the capacitor, illustrated as V1 820) is effectively the valley level plus the input diode voltage drop. The V1 820 node is coupled, across a subtraction diode, to another node labeled V2 825. Another current source is coupled between the V2 825 node and ground (to pass a constant current through the subtraction diode), such that the voltage at V2 825 is effectively the voltage at V1 820 minus the voltage drop across the subtraction diode, which is approximately the valley level (i.e., V1 is approximately the valley level plus a diode voltage drop, and V2 is approximately V1 minus a diode voltage drop; so V2 is approximately the valley level). In some implementations, the V2 825 node can be coupled with a low-pass filter to generate a filtered output voltage, labeled V3 830. The output of the valley detector 800 (e.g., which can correspond to $D_{OUT}$ 145 of FIG. 1) can be V2 825, V3 830, or any other suitable voltage corresponding to V2 825 or V3 830. Other embodiments of the valley detector circuit 140 can include a peak detection circuit to detect a peak level and a high frequency AC signal amplitude of the signal output 130 of the power amplifier circuit. In such embodiments, the valley detector circuit 140 generates the detection output according to a difference between the peak level and high frequency AC signal amplitude.

Embodiments of the power amplifier system 100 operate, such that the supply voltage 115 is regulatable by the power amplifier circuit 120 as a function of the reference voltage input 105 and the valley level input 111 substantially to track the amplitude envelope of the signal output 130 of the power amplifier circuit 120. For example, as the peak of the envelope of the signal output 130 increases, the power amplifier circuit 120 draws more current. This can cause the supply voltage 115 to decrease and can cause the valley of the envelope to be pushed down (e.g., as generally illustrated in FIG. 2). The valley detector circuit 140 can detect that the valley of the envelope is being pushed down relative to the supply voltage 115, and the valley detector circuit 140 can decrease the voltage level at the valley level input 111 of the supply modulator circuit 110, accordingly. This can cause the supply modulator circuit 110 to increase the supply voltage 115 to compensate, which can effectively raise the valley level of the envelope of the signal output 130 (i.e., the valley level is the same distance from the supply voltage 115 level; so raising the supply voltage 115 level can effectively raise the valley level).

Figure 3:
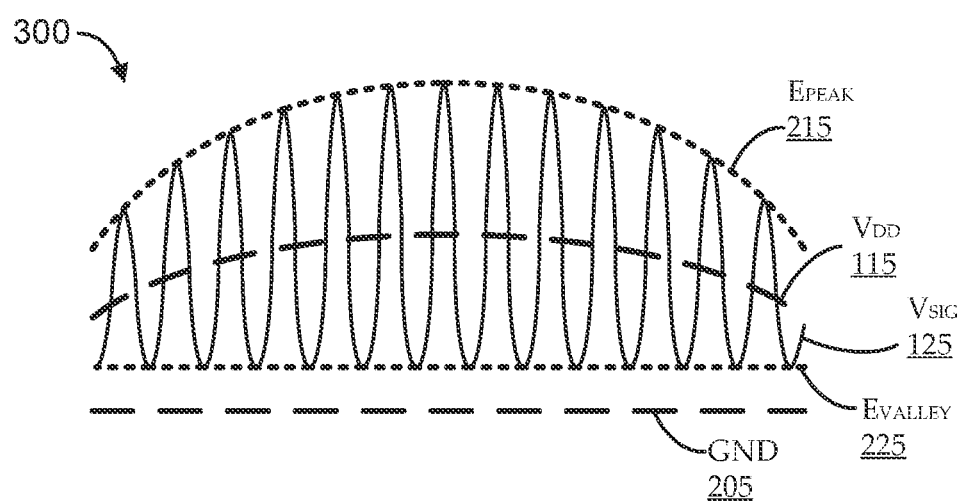
FIG. 3 shows an illustrative waveform of a portion of an RF AM signal using the novel type of envelope tracking described herein.

In this way, the supply voltage 115 to the power amplifier circuit 120 effectively becomes a common mode offset to the signal output 130 that tracks the envelope of the signal output 130. For the sake of illustration, FIG. 3 shows an illustrative waveform 300 of a portion of an RF AM signal using the novel type of envelope tracking described herein. The illustrated waveform 300 can be an example of an output seen at one of the signal outputs 130 of the power amplifier circuit 120 of FIG. 1. As in FIG. 2, the RF signal ($V_{SIG}$) 125 is amplitude modulated, such that its amplitude follows an envelope, and the RF signal 125 is substantially symmetrical around the supply voltage ($V_{DD}$) 115. Unlike FIG. 2, however, the supply voltage 115 substantially tracks the changing envelope of the RF signal 125. As illustrated, regulating the supply voltage 115 in this way tends effectively to double the peak of the envelope ($E_{PEAK}$) 215 and to flatten out the valley of the envelope ($E_{VALLEY}$) 225.

As described above, one feature of such an approach is that the flattened out valley tends to avoid inefficiently providing excessive headroom to components (e.g., of the power amplifier circuit 120). However, it can be desirable to provide at least a minimum amount of headroom to such components. For example, dropping the supply voltage 115 too low can cause transistors and other components to begin operating in non-linear and/or otherwise undesirable modes. As such, embodiments can be configured so that the flattened $E_{VALLEY}$ 225 level remains some amount above the ground level (GND) 205. For example, embodiments can be designed to regulate the supply voltage 115 so that $E_{VALLEY}$ 225 stays substantially at 1 volt, 1.5 volts, or the like.

Figure 4:
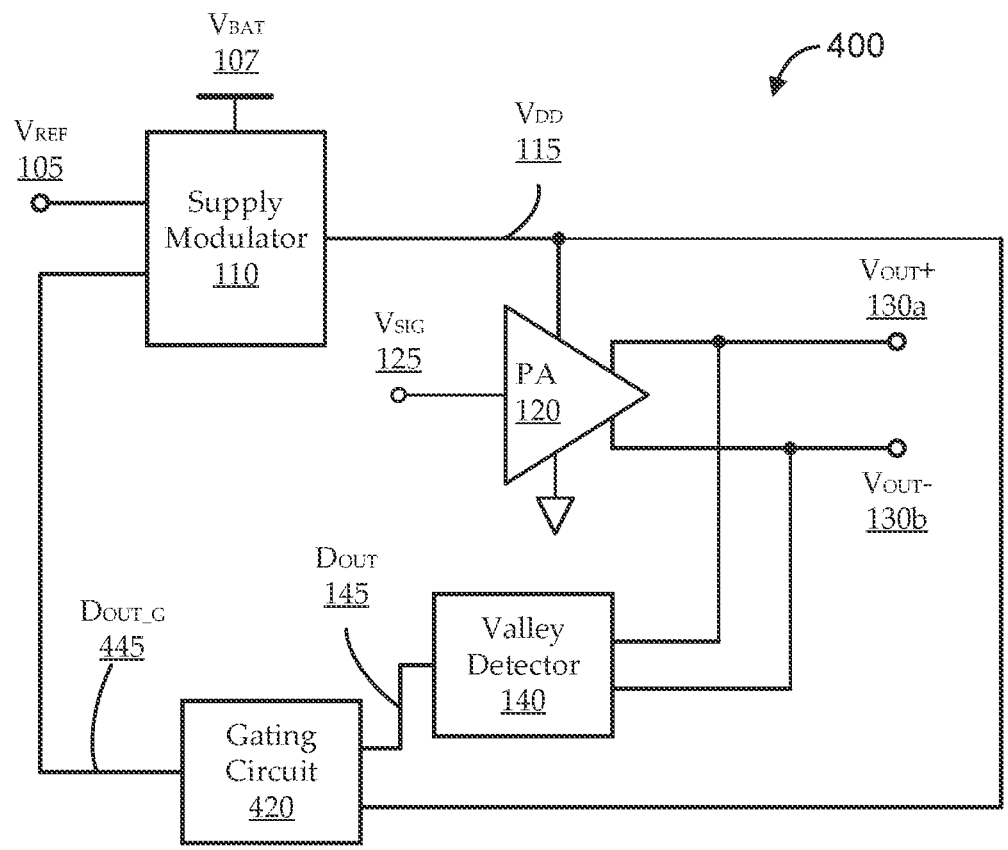
FIG. 4 shows a circuit block diagram of an illustrative power amplifier system having gating, according to various embodiments.

Some embodiments provide additional features for maintaining headroom for components. FIG. 4 shows a circuit block diagram of an illustrative power amplifier system 400 having gating, according to various embodiments. As illustrated, the power amplifier system 400 is substantially the same as the power amplifier system 100 of FIG. 1, with the addition of a gating circuit 420. Embodiments of the gating circuit 420 are coupled with the valley detector circuit 140 and have a gated detection output 445. The gated detection output 445 can be generated, to correspond to the detection output 145 of the valley detector circuit 140 when the supply voltage 115 is above a predetermined minimum supply voltage level. For example, while the supply voltage 115 remains above the predetermined minimum supply voltage level, the gating circuit 420 can effectively pass through the detection output 145. When the supply voltage 115 drops to the predetermined minimum supply voltage level, embodiments of the gating circuit 420 can generate the gated detection output 445 to cause the supply modulator circuit 110 to maintain the supply voltage 115 at a substantially constant level corresponding to the predetermined minimum supply voltage level. For example, due to the gating circuit 420, the supply voltage 115 can be regulated to substantially track the envelope of the signal output 130 (i.e., to flatten the valley level of the envelope) only while the supply voltage 115 remains above the predetermined minimum supply voltage level; and not otherwise.

Figure 5:
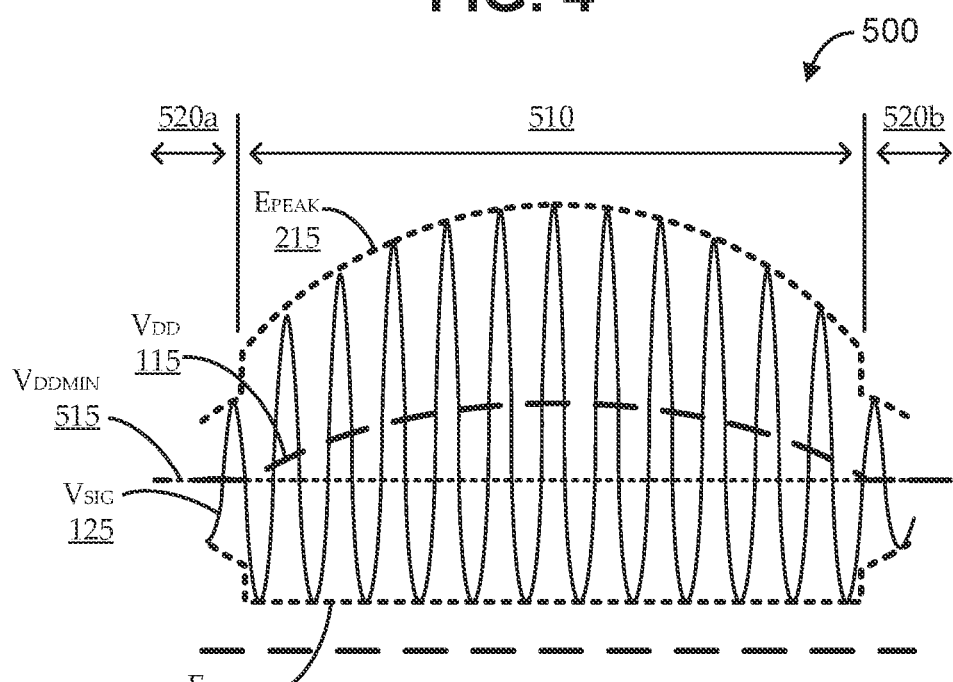
FIG. 5 shows an illustrative waveform of a portion of an RF AM signal using gated envelope tracking.

For the sake of illustration, FIG. 5 shows an illustrative waveform 500 of a portion of an RF AM signal using gated envelope tracking. The illustrated waveform 500 can be an example of an output seen at one of the signal outputs 130 of the power amplifier circuit 120 of FIG. 4. As illustrated, there are some periods of time during which the supply voltage 115 remains above a predetermined minimum supply voltage level ($V_{DDMIN}$) 515 (indicated by time period 510), and other periods of time during which the supply voltage 115 drops to $V_{DDMIN}$ 515 (indicated by time periods 520). It can be assumed that, if not for the gating described with reference to FIG. 4, the supply voltage 115 may be allowed to drop below $V_{DDMIN}$ 515 during time periods 520. Because of the gating, however, the supply voltage 115 is regulated in a manner that holds it substantially constant during time periods 520, which effectively ceases to flatten the valley during time periods 520. In effect, the resulting RF signal 125 looks similar to the waveform 300 of FIG. 3 during time period 510, and the resulting RF signal 125 looks similar to the waveform 200 of FIG. 2 during time periods 520.

As described above, the novel tracking approaches described herein can increase power efficiency by effectively flattening the valley of the amplitude envelope of the power amplifier circuit 120 output. In the embodiments of FIGS. 4 and 5, the novel tracking approach is used only some of the time. However, the times during which the tracking is not being used corresponds to the times when the output signal amplitude is relatively low, such that there is a relatively small amount of power loss due to tracking inefficiencies during these times.

In some cases, the valley level of the envelope can also be pushed down when the power amplifier circuit 120 applies excessive gain to the input signal. As described above, the supply modulator circuit 110 is driven by a source voltage 107, and the supply voltage 115 that is output by the supply modulator circuit 110 is limited by the source voltage 107. Because the power amplifier circuit 120 is driven by the supply voltage 115, and the supply voltage 115 is limited by the source voltage 107, the peak amplitude of the output signal is similarly limited (e.g., to twice the source voltage 107, or some small delta below that). As described above, the output signal of the power amplifier circuit 120 is substantially symmetrical around the supply voltage 115 (e.g., the supply voltage 115 is substantially the average of the envelope magnitude at any time). As such, if the power amplifier circuit 120 applies an amount of gain to the input signal that causes the output signal peak to exceed the peak amplitude, this may tend to push down the supply voltage 115 level; reducing the supply voltage 115 level effectively increases the distance between the peak and the supply voltage 115, when the peak cannot increase beyond the maximum peak level. This can also push down the valley level. As described above, it can be undesirable for the valley level to be pushed down below a minimum level. Accordingly, some embodiments include pushdown detection functionality.

Figure 6:
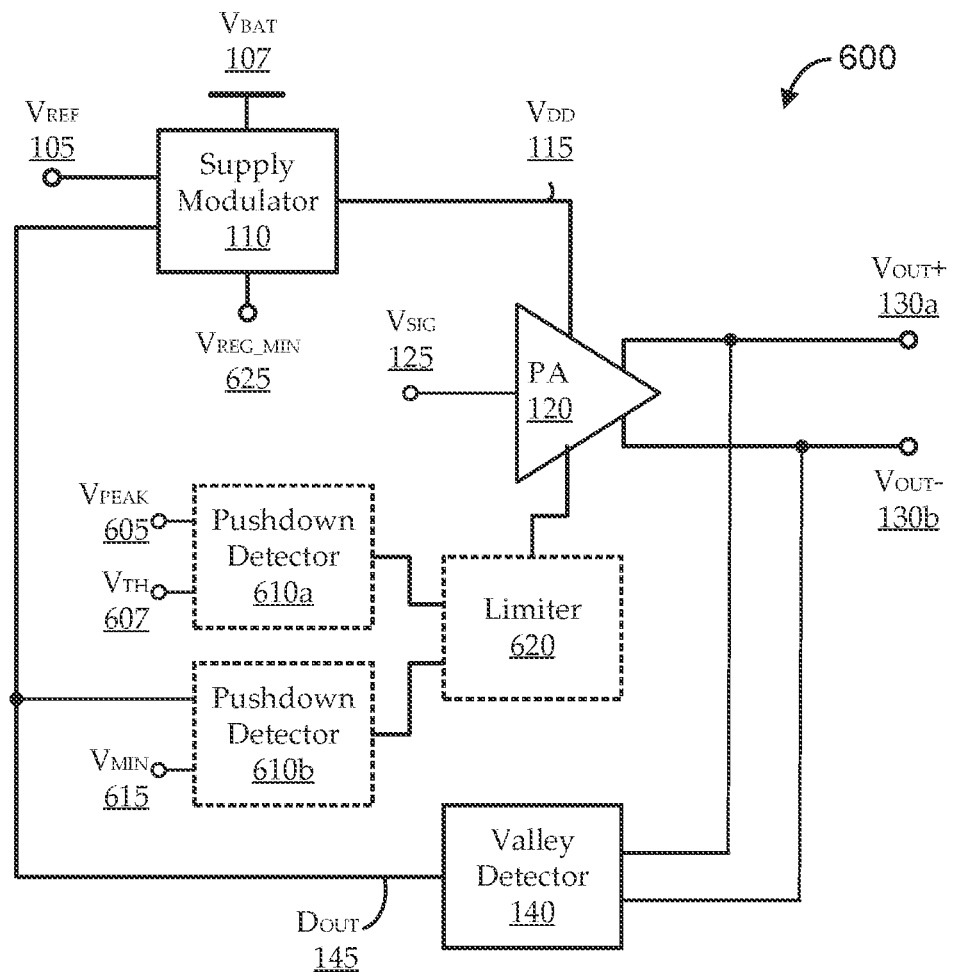
FIG. 6 shows a circuit block diagram of an illustrative power amplifier system having pushdown detection, according to various embodiments.

FIG. 6 shows a circuit block diagram of an illustrative power amplifier system 600 having pushdown detection, according to various embodiments. As illustrated, the power amplifier system 600 is substantially the same as the power amplifier system 100 of FIG. 1, with the addition of a pushdown detector 610 and a limiter 620. Embodiments of the pushdown detector 610 detect whether the valley level is pushed below a predetermined minimum valley level. Embodiments of the limiter 620 are coupled with the pushdown detector 610 and the power amplifier circuit 120 to limit the gain applied to the signal input 125 in response to the pushdown detector 610 detecting that the valley level is pushed below the predetermined minimum valley level. For example, in response to detecting that the valley level is pushed below the predetermined minimum valley level, the limiter 620 can direct the power amplifier circuit 120 to reduce the gain being applied. In some implementations, the power amplifier circuit 120 applies gain according to a gain code, and the limiter 620 can direct the power amplifier circuit 120 to reduce the gain being applied by directing it to back off the gain code.

The pushdown detection can be implemented in various ways. In some implementations, the pushdown detector 610 has a pushdown input coupled with the detection output 145 of the valley detector circuit (e.g., or the gated detection output 445 of a gating circuit 420) and a minimum valley level input ($V_{MIN}$) 615 corresponding to the predetermined minimum valley level. Such implementations can detect whether the valley level is pushed below the predetermined minimum valley level by comparing the pushdown input with the minimum valley level input 615. In other implementations, the pushdown detector 610 includes a first pushdown input ($V_{PEAK}$) 605 to receive a peak level of the signal output of the power amplifier circuit 120, and a second pushdown input ($V_{TH}$) 607 to receive a predetermined maximum peak level corresponding to twice the source voltage 107 (e.g., twice the source voltage 107 minus a predetermined small delta). Such implementations can indirectly detect whether the valley level is pushed below the predetermined minimum valley level by comparing $V_{PEAK}$ 605 to $V_{TH}$ (e.g., the valley level is apparently pushed below the predetermined minimum valley level when $V_{PEAK}$ 605≥$V_{TH}$). Other techniques can be used to determine when the valley level is apparently pushed below the predetermined minimum valley level. For example, the valley level can be determined as pushed below the predetermined minimum valley level by detecting when a peak of the RF signal (i.e., the difference between peak of the envelope and the valley of the envelope) reaches or exceeds a maximum envelope signal peak level (e.g., twice the source voltage minus a predetermined small delta minus the regulated valley level). As another example, the valley level can be determined as pushed below the predetermined minimum valley level by detecting when a peak of the supply voltage 115 reaches or exceeds a maximum supply peak level (e.g., half of the sum of the regulated valley level and twice the source voltage minus a predetermined small delta).

Figure 7:
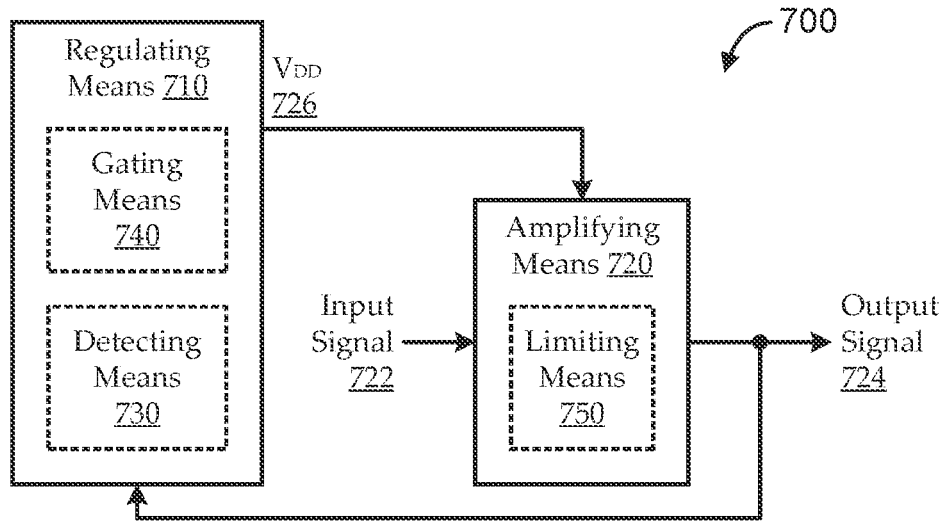
FIG. 7 shows a block diagram of an illustrative power amplifier system, according to various embodiments.

FIG. 7 shows a block diagram of an illustrative power amplifier system 700, according to various embodiments. The power amplifier system 700 includes a regulating means 710 and an amplifying means 720. As described herein, the amplifying means 720 can include any suitable means for amplifying an output signal 724 by applying gain to an input signal 722 and applying a common mode offset to the output signal 724 according to a supply voltage ($V_{DD}$) 726. For example, the amplifying means 720 can include a linear or polar power amplifier having a single-ended output or a differential pair of outputs. The regulating means 710 can include any suitable means for regulating the supply voltage 726 to dynamically track an amplitude envelope of the output signal 724 as a function of dynamically detecting a valley level of the output signal 724.

In some embodiments, the regulating means 710 includes detecting means 730 for detecting the valley level of the output signal 724. The detecting means 730 can include any suitable means, such as circuitry to directly or indirectly detect the valley level of the output signal 724. Some embodiments of the regulating means 710 can also include gating means 740. The gating means 740 can include any suitable means for gating regulating functions of the regulating means 710, such that the supply voltage 726 dynamically tracks the amplitude envelope of the output signal 724 only when the supply voltage 726 is above a predetermined minimum supply voltage level. Some embodiments of the amplifying means 720 include limiting means 750. The limiting means 750 can include any suitable means for limiting the gain applied to the input signal 722 in response to detecting that the valley level is pushed below a predetermined minimum valley level. Some implementations of the limiting means 750 are coupled with the detecting means 730 to receive the valley level therefrom, and to determine when the valley level is pushed below a predetermined minimum valley level, accordingly. Other implementations of the detecting means determine when the valley level is pushed below a predetermined minimum valley level in other ways.

Figure 9:
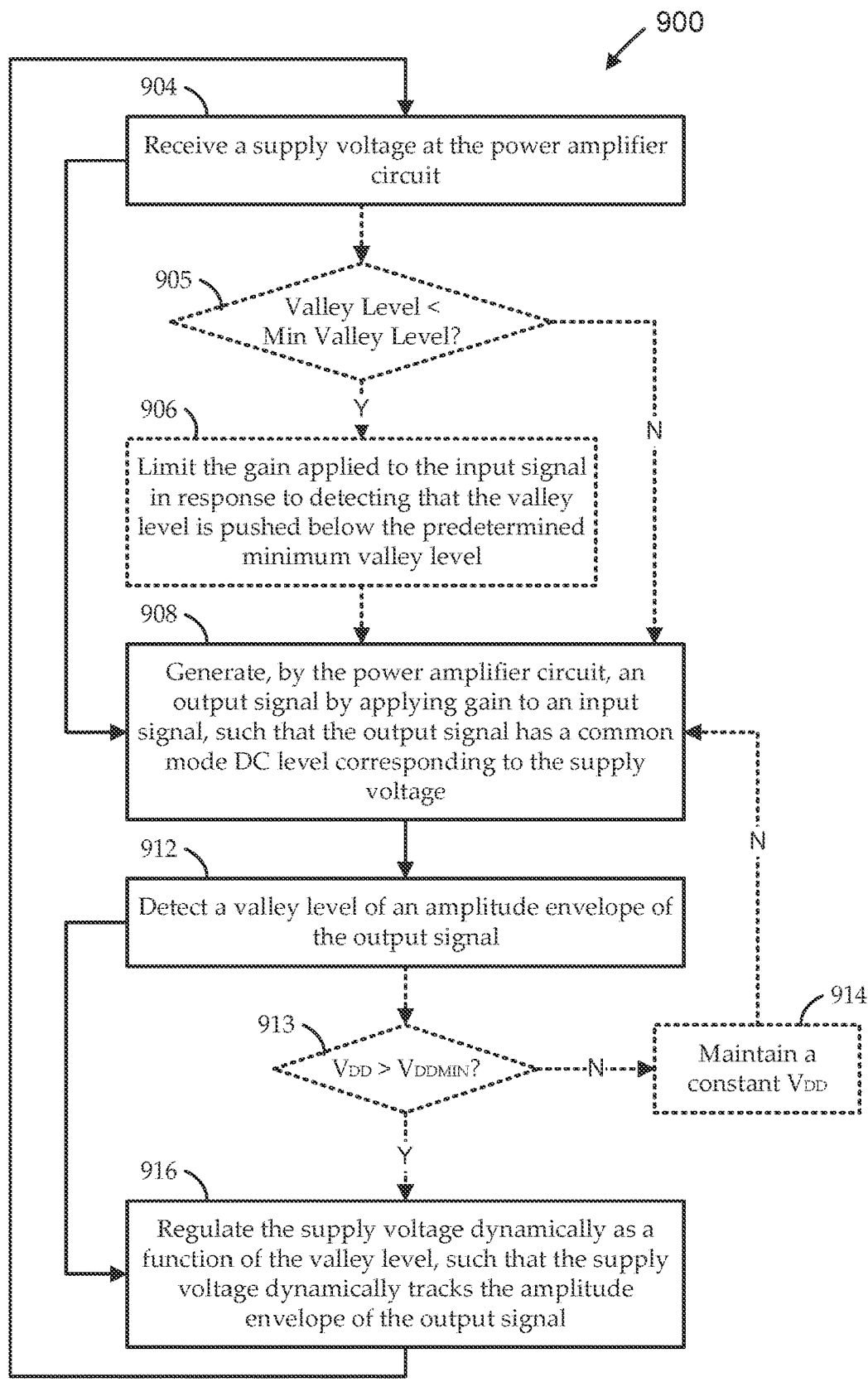
FIG. 9 shows a flow diagram of an illustrative method for supply voltage modulation in a power amplifier circuit, according to various embodiments.

FIG. 9 shows a flow diagram of an illustrative method 900 for supply voltage modulation in a power amplifier circuit, according to various embodiments. Embodiments of the method begin at stage 904 by receiving a supply voltage at the power amplifier circuit. At stage 908, embodiments can generate, by the power amplifier circuit, an output signal by applying gain to an input signal, such that the output signal has a common mode DC level corresponding to the supply voltage. In some embodiments, at stage 905, a determination is made as to whether the valley level is pushed below a predetermined minimum valley level. For example, when the power amplifier circuit attempts to apply an amount of gain to the input signal that causes the peak of the output signal to exceed a maximum supply voltage (e.g., a little less than twice the source voltage for the supply regulator, such as a battery voltage), this can cause the valley to be pushed down to make room. Such embodiments can proceed to generating the output signal in stage 908 without limits on gain only when the determination at stage 905 is that the valley level is not pushed below the predetermined minimum valley level. If the determination at stage 905 is that the valley level is pushed below the predetermined minimum valley level, embodiments can, at stage 906, limit the gain applied to the input signal in response thereto.

At stage 912, embodiments can detect a valley level of an amplitude envelope of the output signal. In some embodiments, the detecting includes directly detecting the valley level of the amplitude envelope of the signal output of the power amplifier circuit. In other embodiments, the detecting includes detecting a peak level of the output signal, and detecting the valley level indirectly by detecting a difference between the supply voltage and the peak level.

At stage 916, embodiments can regulate the supply voltage dynamically as a function of the valley level, such that the supply voltage dynamically tracks the amplitude envelope of the output signal. In some embodiments, the regulating includes comparing the valley level with a fixed reference voltage level, such that the supply voltage is generated as a function of the comparing. Some embodiments, at stage 913, make a determination as to whether the supply voltage is above a predetermined minimum supply voltage level. Such embodiments may proceed to regulate at stage 916 (e.g., such that the supply voltage dynamically tracks the amplitude envelope of the output signal) only when the determination at stage 913 is that the supply voltage is above a predetermined minimum supply voltage level. Otherwise, embodiments can maintain a substantially constant supply voltage (e.g., at or near the minimum supply voltage) at stage 914.

Open-Loop Valley Regulation

Embodiments described above generally use a closed feedback loop to track the valley level of the power amplifier output and to dynamically adjust generation of the supply voltage level to maintain a substantially constant valley level. In some applications, such a closed feedback loop can be too slow to provide reliable tracking, which can result in loop instability. For example, referring to the illustrative power amplifier system 100 of FIG. 1, the supply voltage signal coming from the output of the supply modulator 110 can manifest inductive and capacitive effects, which can slow their dynamic responsiveness. Similarly, the valley detector 140 can be relatively slow to respond. In some applications, such limits to the responsiveness of the closed feedback loop can result in loop instability.

Some embodiments can use open-loop compensation for various reasons, such as to avoid potential closed-loop instability. In such embodiments, a calibration phase is used to record relationships between each of multiple signal amplitude levels (e.g., for a given reference voltage level) and a corresponding valley level of the output signal generated at that signal amplitude level. For example, at each higher signal amplitude level, the valley level tends to decrease, and the relationship between that signal amplitude level and that resulting valley level is recorded. A respective compensation value can be computed for each of the recorded relationships to yield a substantially constant valley level across all of the multiple signal amplitude levels. During an operating phase, the output of the supply modulator can be controlled based on a presently selected compensation values, and the presently selected compensation value can be based on monitoring a present signal amplitude level.

Figure 10:
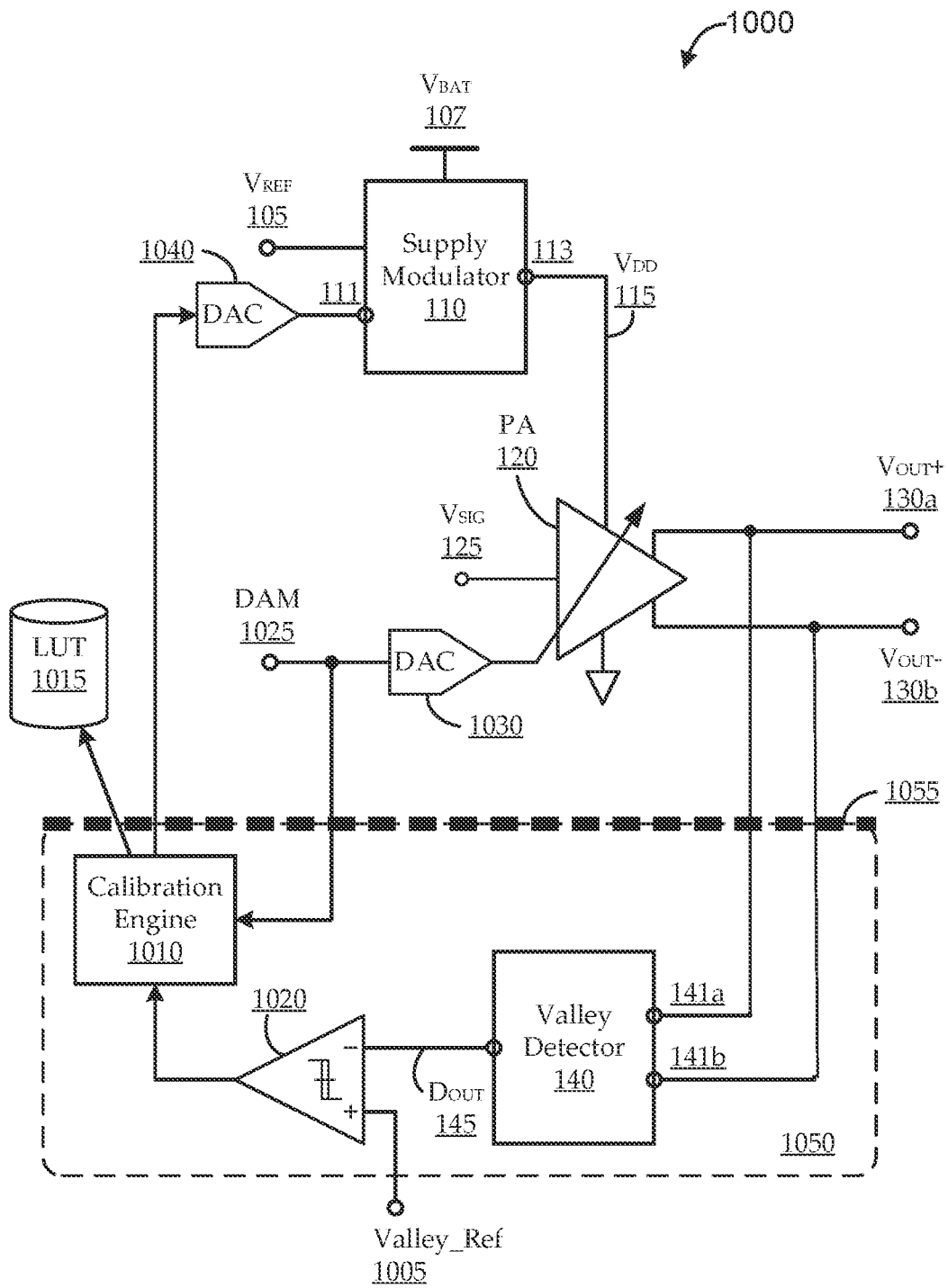
FIG. 10 shows an illustrative power amplifier system 1000 having open-loop valley regulation in a calibration phase configuration, according to various embodiments described herein.

FIG. 10 shows an illustrative power amplifier system 1000 having open-loop valley regulation in a calibration phase configuration, according to various embodiments described herein. As described below, the calibration phase is used to pre-compute compensation values for each of a set of gain settings of a power amplifier prior to operation of the power amplifier in an operating phase. In some cases, the power amplifier is a circuit of an integrated circuit chip, and the calibration phase is performed at a single time prior to installation of the chip into a larger system context. For example, the calibration is performed in a test bench setup, or the like. In other cases, the calibration phase is performed at a single time after integration of the chip into a larger system context. In other cases, the calibration phase is performed at any suitable time and/or interval. For example, the calibration phase is performed as part of a startup sequence whenever a system that includes the power amplifier is started up, as part of a periodic health check routine, etc.

As in FIG. 1, the power amplifier system 1000 includes a supply modulator circuit 110, a power amplifier circuit 120, and a valley detector circuit 140. Embodiments of the supply modulator circuit 110 include a supply output 113 to output a supply voltage ($V_{DD}$) 115 responsive to an input signal. One such input signal is shown as the valley level input 111. As described below, the valley level input 111 can be generated by an output of a calibration engine 1010 during a calibration phase and/or by an output of a valley compensator (shown in FIG. 11) during an operating phase. In some implementations, a reference voltage input 105 is also received as an input signal to the supply modulator circuit 110. For example, the reference voltage input 105 can be any stable voltage level generated by any suitable circuit, or other component.

Embodiments of the power amplifier circuit 120 are driven by the supply voltage 115, such that the supply voltage 115 effectively defines a common mode voltage level. The power amplifier circuit 120 has a signal input 125 and a signal output 130. The signal output 130 is generated by driving the power amplifier circuit 120 with the supply voltage 115 and applying a gain to the signal input 125 according to a gain setting. In some implementations, the power amplifier circuit 120 has a double-ended output (the signal output 130 includes a first signal output 130a and a second signal output 130b), such as by implementing the power amplifier circuit 120 as a differential-output power amplifier. In some implementations, the power amplifier is a polar power amplifier. In some implementations, the signal input 125 is a pulse width modulated (PWM) signal, or the like.

In FIG. 1, the power amplifier circuit 120 is described as applying a variable gain to the signal input 125. In FIG. 10, this variable gain is more explicitly illustrated. In some embodiments, such as the illustrated embodiment, a digital amplitude (DAM) signal 1025 is converted to an analog signal by digital-to-analog converter 1030, and the analog signal is used to control the variable gain of the power amplifier circuit 120. The DAM signal 1025 can be a digital signal that indicates a particular gain setting value. For example, the DAM signal 1025 can indicate one of a predetermined set of gain settings to define a range of gain settings for the power amplifier circuit 120. The amplitude of the signal output 130 is directly correlated to the gain setting indicated by the DAM signal 1025. As such, "amplitude" can essentially be seen as an input to the power amplifier system 1000.

The signal output 130 is provided to a calibration sub-system 1050. As illustrated, the calibration sub-system 1050 includes the valley detector circuit 140, and the signal output 130 is provided to a detection input 141 (or a pair of differential detection inputs 141) of the valley detector circuit 140. The valley detector circuit 140 can generate a detection output 145 as a function of the detection input(s)

141 substantially to track a valley level of an amplitude envelope of the signal output 130 of the power amplifier circuit 120 (e.g., the detection output 145 is the valley level, or otherwise corresponds to the valley level). In embodiments described above, the detection output 145 is fed back as an input to the supply modulator circuit 110 to provide closed-loop feedback, thereby facilitating dynamic modulating of the supply voltage 115 to maintain a substantially constant valley level. Similarly, in the power amplifier system 1000 of FIG. 10, the valley detector circuit 140 is used to generate the detection output 145 as a function of the detection input(s) 141 substantially to track the valley level of the amplitude envelope of the signal output 130 of the power amplifier circuit 120.

Rather than feeding the detection output 145 back to the supply modulator circuit 110, the detection output 145 can be used by the calibration engine 1010 to generate calibration relationships (i.e., to generate a respective calibration value for each gain setting). Embodiments of the calibration engine 1010 are configured, for each value of the DAM signal 1025 (i.e., for each input gain setting), to compute a respective compensation value based on one or more output valley level measurements as indicated by the detection output 145. The calibration engine 1010 can store each generated compensation value in a lookup table 1015 in association with its corresponding gain setting.

In some implementations, the calibration engine 1010 computes each compensation value based on a direct measurement of the present output valley level. For example, if it is desired to maintain the valley level at 0.5 volts for all gain settings, and the present output valley level at a particular gain setting is detected to be 1.2 volts, the compensation value can be computed to compensate for the 0.7-volt difference between the present output valley level and the predetermined target valley level (e.g., the compensation value is generated to cause the supply modulator circuit 110 to output a compensated supply voltage resulting in a 0.7-volt downward shift of the common mode of the signal output 130, as described below). In other implementations, the calibration engine 1010 computes each compensation value based on present data characterizing the signal output 130 that indirectly measures the present output valley level. For example, as described below, the calibration engine 1010 can use the supply voltage level and a measurement of the present amplitude of the signal output 130 to determine the present output valley level. In such implementations, the compensation value can be similarly computed to compensate for any difference between the present output valley level and the predetermined target valley level.

In some implementations, as illustrated, the detection output 145 is fed to a comparator 1020, which compares the detection output 145 against a valley reference signal 1005 to generate a comparator output. The valley reference signal 1005 can be a substantially constant (e.g., DC) voltage level that effectively sets a desired target valley level to maintain across a range of signal amplitude levels. In such implementations, the calibration engine 1010 can compute the respective compensation values, for each gain setting, by iteratively trying candidate compensated supply voltage levels until one is found to cause the generated signal output 130 to have a present output valley level that is substantially at the predetermined target valley level. For example, the calibration engine 1010 directs setting of the DAM signal 1025 to each of some or all of the gain settings. At each gain setting, the calibration engine 1010 iteratively directs the supply modulator circuit 110 to generate the supply voltage 115 at different candidate compensated supply voltage levels (e.g., by trying different compensation values, each corresponding to one of the candidate compensated supply voltage levels). Each time the candidate compensated supply voltage level changes, present output valley level changes for the signal output 130 being generated by the power amplifier circuit 120 at the current gain setting. For example, for each gain setting indicated by the DAM signal 1025 (e.g., DAM_i, where i=1 to N), the power amplifier circuit 120 generates the signal output 130 to have a particular output amplitude (e.g., half of its peak-to-peak amplitude). The valley level of the signal output 130 (e.g., at some point along $E_{VALLEY}$ 225 in FIG. 2) is effectively defined by the current supply voltage 115 (which is being set at a candidate compensated supply voltage level) less the output signal amplitude (which is a function of the current gain setting). Referring to FIG. 2, it can be seen that, as the gain of the power amplifier circuit 120 increases (based on increasing the gain setting applied by the DAM signal 1025), the valley level decreases. The change in present output valley level is reflected by the detection output 145 of the valley detector circuit 140. At some point, one of the candidate compensated supply voltage levels will cause the present output valley level to be substantially at the predetermined target valley level, as will be reflected by a change in the comparator output. Thus, the change in the comparator output can signal to the calibration engine 1010 to generate the calibration value based on whichever candidate compensated supply voltage level is currently being applied to the power amplifier circuit 140.

The calibration engine 1010 can iterate through the different candidate compensated supply voltage levels in any suitable manner. Such iterating can generally be referred to as "searching." For example, for every DAM signal 1025 value (e.g., for each of N possible gain settings), the calibration engine 1010 searches for a candidate compensated supply voltage level that will cause the detection output 145 to be approximately equal to the valley reference signal 1005. In such implementations, the calibration engine 1010 can use any suitable search algorithms, such as successive approximation, linear searching, etc. It can be seen that such searching (and/or other approaches) may not result in the present output valley level being precisely equal to the predetermined target valley level. For example, in the illustrated implementation, the comparator 1020 can be configured to flip its output as soon as the present output valley level falls below the predetermined target valley level, or when the present output valley level falls below a set threshold above the predetermined target valley level, etc. In any such cases, the comparator 1020 output will reflect a calibrated condition (e.g., a best choice for the compensated supply voltage level at the current gain setting) when the present output valley level is near, but not necessarily precisely at, the predetermined target valley level. Reference herein to the present output valley level being "substantially" at the predetermined target valley level is intended to mean that the present output valley level is close enough to the predetermined target valley level (e.g., just below) to be detected as a calibrated condition.

While the relationships between each DAM signal 1025 gain setting and the resulting amplitude of the signal output 130 (e.g., and the resulting valley level) can be highly deterministic (e.g., consistent and repeatable), those relationships can also be affected by difference characteristics of different power amplifier circuits 120. For example, process variations, component variations, and the like can impact the precise amount of gain applied by the power amplifier circuit 120 in response to a particular DAM signal 1025. By using the calibration phase to build and record the set of relationships between each DAM signal 1025 setting and its corresponding calibration level, the resulting calibration data effectively accounts for any process variations, component variations, and/or other such characteristics of the manufactured power amplifier circuit 120. As noted above, the set of relationships can be stored in a lookup table (LUT) 1015. Reference here to a "lookup table" is intended generally to include any suitable manner of storing the relationships, and is not limited to any particular type of storage or storage format.

Thus, the calibration phase results in a stored set of relationships between each DAM signal 1025 value (i.e., each gain setting) and a corresponding compensation value, and each compensation value indicates a compensated supply voltage level. By driving the power amplifier circuit 120 with the appropriate compensated supply voltage level for each gain setting of the DAM signal 1025, it can be seen that the output valley level of the signal output 130 can be maintained substantially at the predetermined target valley level across the range of gain settings. For example, at a reference supply voltage 115 of 3.0 volts and a gain setting of '1', suppose that the amplitude of the signal output 130 is 0.1 volts, such that the valley level is 2.9 volts. If it is desired to maintain a substantially constant valley level of 0.5 volts across all gain settings (e.g., the power amplifier circuit 120 operates efficiently at that valley level), the compensation value may be computed to reflect a compensated supply voltage 115 of 0.6 volts. The compensation value can be any value usable by the supply modulator circuit 110 to output the supply voltage 115 at the desired compensated supply voltage level. In one implementation, the compensation value directly indicates the desired compensated supply voltage 115 setting (e.g., 0.6 volts in the preceding example). In another implementation, the compensation value indicates a difference between the reference supply voltage 115 level and the desired supply voltage 115 setting (e.g., −2.4 volts in the preceding example).

During the calibration phase, for each DAM signal 1025 value, the calibration engine 1010 receives valley level information for one or more supply voltage levels, computes a corresponding compensation value based on the received valley level information, and stores the computed corresponding compensation value in the LUT 1015 in association with the present DAM signal 1025 value. In some implementations, the calibration engine 1010 stores additional information (e.g., valley level information) in the LUT 1015 in association with corresponding DAM signal 1025 values.

For added clarity, an illustrative table of calibration data is as follows:

| Gain Setting (DAMi) | Output Amplitude (V) | Output Valley Level (V) | Compensated Supply Voltage (V) |
|---|---|---|---|
| 0 | 0.24 | 2.76 | 0.74 |
| 1 | 0.41 | 2.59 | 0.91 |
| 2 | 0.55 | 2.45 | 1.05 |
| 3 | 0.69 | 2.31 | 1.19 |
| ... | ... | ... | ... |
| 14 | 2.35 | 0.65 | 2.85 |
| 15 | 2.49 | 0.51 | 2.99 |

While the "Gain Setting" is shown as a digital value between 0 and 15, the DAM signal 1025 can represent any suitable number of gain settings (e.g., more or fewer than 16), and/or in any suitable manner. As described above, some implementations do not directly measure output amplitude, output valley level, etc.; those columns are provided to illustrate mathematical relationships. The above table assumes a reference voltage level of 3.0 volts and a target valley level of 0.5 volts. For example, at a gain setting of "3", the compensated supply voltage is 1.19 volts and the output amplitude is 0.69 volts, such that the valley level is 0.5 volts. Similarly, at a gain setting of "14", the compensated supply voltage is 2.85 volts and the output amplitude is 2.35 volts, such that the valley level is still 0.5 volts.

In some implementations, the target valley level is predetermined (e.g., at 0.5 volts, or any other suitable value). For example, the valley reference signal 1005 is set to the predetermined level. In other implementations, the target valley level can be determined as part of the calibration phase. For example, the minimum valley level can correspond to the maximum gain setting. Referring to the table above, the minimum valley level is 0.51 volts at the maximum gain setting of "15". In one such implementation, the calibration phase begins by setting the DAM signal 1025 to indicate a highest gain setting, and a recorded calibration value at that setting is used to set the target valley level. In the above example, the compensated supply voltages would be adjusted according. For example, at a gain setting of "3", the output amplitude is still 0.69 volts, but the compensated supply voltage would be computed as 1.2 volts to yield a valley level of 0.51 volts.

As described above, the DAM signal 1025 can be used to indicate any of some integer number (N) of gain settings. In some embodiments, the calibration phase cycles through all N gain settings (e.g., sequentially, or in any suitable order) to obtain N corresponding calibration detection output 1045 values and to compute N corresponding compensation values. In some such embodiments, the calibration phase cycles through some or all of the gain settings more than once, such as to confirm values. For example, a second cycle can be used to verify values computed in a first cycle, or multiple cycles can be used and results can be aggregated (e.g., averaged, etc.) for computation of the compensation values. In other embodiments, the calibration phase cycles through only a selected portion of the gain settings (e.g., K of the N gain settings). In some such embodiments, K compensation values can be computed based on performing a calibration routine (e.g., iterating through candidate compensated supply voltage levels while monitoring the comparator 1020 output) at each of K gain settings; for the other N−K gain settings, corresponding compensation values can be computed based on the K compensation values. For example, interpolation, extrapolation, and/or other techniques can be applied to the K compensation values to compute the other N−K compensation values.

Upon completion of the calibration phase, the LUT 1015 can include a stored set of relationships, such as representing each compensation value (and/or compensated supply voltage) in association with a corresponding gain setting (and/or DAM signal 1025 value). The stored relationships dictate that, when applying any particular gain setting (according to the DAM signal 1025 value) to the power amplifier circuit 120, setting the supply voltage 115 based on the corresponding compensation value from the LUT 1015 will cause the valley level of the resulting signal output 130 to be substantially at the predetermined target valley level. Once the relationships are computed and stored in the LUT 1015, the predetermined target valley level can be maintained without continuing to receive dynamic feedback from the valley detector circuit 140 (or continued computation by the calibration engine 1010). Thus, the valley detector circuit 140, the calibration engine 1010, and the comparator 1020 can be considered as part of a calibration subsystem 1050, which can also include a selective coupling 1055. The selective coupling 1055 can be configured to couple the calibration subsystem 1050 into the power amplifier system 1000 during the calibration phase, and to decouple the calibration subsystem 1050 from the power amplifier system 1000 during an operating phase. The selective coupling 1055 can include any suitable components. For example, one implementation of the selective coupling 1055 includes one or more switches (e.g., dip switches, transistors, etc.) between at least the detector input(s) 141 and the signal output 130. Another implementation of the selective coupling 1055 includes one or more interfaces (e.g., cable connector, interface pin, etc.) by which the calibration subsystem 1050 can be coupled to, or decoupled from, other portions of the power amplifier system 1000.

Figure 11:
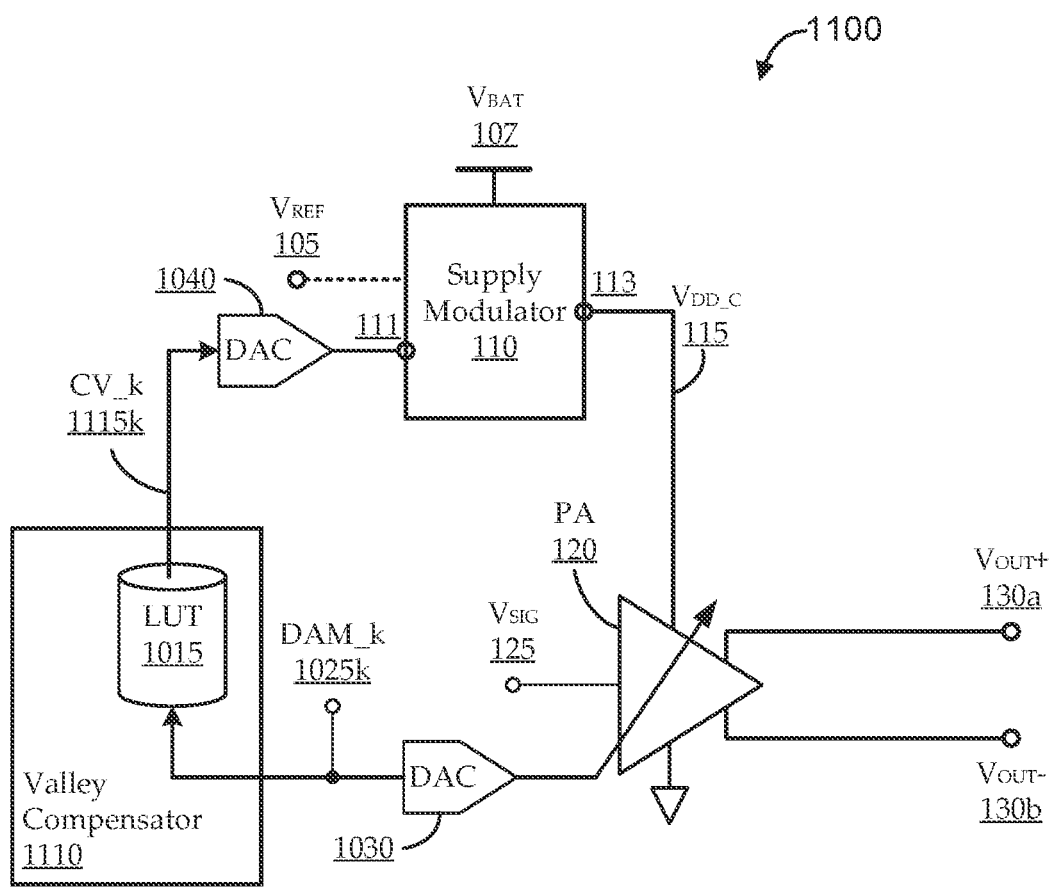
FIG. 11 shows an illustrative power amplifier system 1100 having open-loop valley regulation in an operating phase configuration, according to various embodiments described herein.

FIG. 11 shows an illustrative power amplifier system 1100 having open-loop valley regulation in an operating phase configuration, according to various embodiments described herein. The power amplifier system 1100 is the power amplifier system 1000 of FIG. 10 with the calibration subsystem 1050 components removed. For example, as described above, the calibration subsystem 1050 of FIG. 10 can be selectively coupled with other components of the power amplifier system 1100 via a selective coupling 1055, and FIG. 11 represents that the calibration subsystem 1050 components are effectively not part of the system during the operating phase (i.e., they are therefore not illustrated as part of the system 1100). In some implementations, the calibration subsystem 1050 components illustrated in FIG. 10 are implemented as part of an external system, such as a test bench setup, or another circuit that can be selectively coupled with the power amplifier system 1100. In other implementations, the calibration subsystem 1050 components illustrated in FIG. 10 are coupled with other components of the power amplifier system 1100 of FIG. 11 by switches, or the like.

As in FIG. 10, the power amplifier system 1100 includes a supply modulator circuit 110, a power amplifier circuit 120, and a LUT 1015. In FIG. 11, the LUT 1015 is shown as part of a valley compensator 1110. The LUT 1015 can be the same LUT 1015 as the one illustrated in FIG. 10, even though the valley compensator 1110 is not explicitly shown in FIG. 10. It is assumed that the calibration phase has already completed, such that the LUT 1015 is populated with a set of relationships that associate a corresponding compensation value with each of multiple DAM signal 1025 levels (gain settings). During the operating phase, as in the calibration phase, the power amplifier circuit 120 generates a signal output 130 by applying an amount of gain to a signal input 125 in accordance with the gain setting indicated by the DAM signal 1025. The generated signal output 130 is centered around (e.g., has a common mode voltage corresponding to) the supply voltage 115 driving the power amplifier circuit 120.

As described above, during normal operation, the supply modulator circuit 110 generates and outputs the supply voltage 115 based at least on a valley level input 111. The supply voltage 115 is labeled as $V_{DD\_C}$ to indicate that, during operation, the supply voltage 115 can always be generated at one of the compensated supply voltage levels according to a presently selected compensation value for a current gain setting. In some of the above-described embodiments, the valley level input 111 was described more specifically as representing direct feedback from the valley detector circuit 140. For example, in FIG. 1, a detection output 145 from the valley detector circuit 140 is directly fed back as the valley level input 111. As described with reference to FIG. 10, the valley level input 111 in FIG. 11 can instead represent a compensation value from the LUT 1015 that corresponds to a present value of the DAM signal 1025. For example, for any kth gain setting signal (DAM_k 1025k) input to the LUT 1015, the LUT 1015 can output a corresponding kth compensation signal (CV_k 1115k) representing a compensation value computed during the calibration phase. In some implementations, the compensation signal 1115 output by the LUT 1015 (or any suitable component of the valley compensator 1110) is used directly by the supply modulator circuit 110. In other implementations, the compensation signal 1115 is output by the LUT 1015 as a digital signal and converted into an analog signal by a digital-to-analog converter (DAC) 1040. The analog signal generated by DAC 1040 can be input to the supply modulator circuit 110 as the valley level input 111.

In some implementations, the compensation signal 1115 (e.g., after conversion by the DAC 1040) is a voltage level corresponding to the compensated supply voltage to be output by the supply modulator circuit 110 (to maintain a substantially constant target valley level). For example, generation of the supply voltage 115 by the supply modulator circuit 110 involves regulating its output at node 113 to match its input at node 111. In other implementations, the compensation signal 1115 (e.g., after conversion by the DAC 1040) is a voltage level corresponding to a difference voltage between the reference supply level and the compensated supply voltage to be output by the supply modulator circuit 110. For example, the reference supply level is provided to the supply modulator circuit 110 as the reference voltage input 105, the difference voltage is provided to the supply modulator circuit 110 as the valley level input 111, and the supply modulator circuit 110 generates the supply voltage 115 to be the reference supply level less the difference voltage. In other implementations, the compensation signal 1115 is a digital (e.g., or analog, after conversion by the DAC 1040) signal representing one of a predetermined number of codes, each code representing a particular output setting for the supply modulator circuit 110. The supply modulator circuit 110 can then generate the supply voltage 115 based on the received code.

During operation of the power amplifier system 1100, the power amplifier circuit 120 is used generate the signal output 130 with amplitude modulation, as controlled by DAM signal 1025. At any time, DAM signal 1025 indicates a particular one of the gain settings. Concurrent with the gain setting being fed to the power amplifier circuit 120 to control the gain (i.e., to control the amplitude of the signal output 130), the same gain setting is also being fed to the valley compensator 1110. In response, the valley compensator 1110 looks up the corresponding compensation value in the LUT 1015, and generates and outputs a corresponding compensation signal 1115 (e.g., directly, or via DAC 1040) to the supply modulator circuit 110. For example, when the valley compensator 1110 receives DAM_k 1025k, it looks up and outputs the kth compensation signal, CV_k 1115k. The supply modulator circuit 110 generates the supply voltage 115 responsive to the compensation signal 1115 to be at the compensated supply voltage level corresponding to the compensation signal 1115. As such, the common mode of the signal output 130 is set to a level where the valley level of the signal output 130 is substantially at the predetermined target level. Embodiments are designed to ensure that the response time of the valley compensator 1110 (i.e., the time to receive an update to the DAM signal 1025, lookup a new compensation value, and output the appropriate corresponding compensation signal 1115) is appreciably faster than the rate of change of the DAM signal 1025.

Using an example from the table above, responsive to the DAM signal 1025 updating to a gain setting of "3", the power amplifier circuit 120 adjusts its gain accordingly to begin generating the signal output 130 with an amplitude is 0.69 volts. Concurrently, the valley compensator 1110 responsively updates its output to a compensation value signal 1115 that causes the supply voltage 115 to output a compensated supply voltage 115 of 1.19 volts. As such, the signal output 130 is generated by the power amplifier circuit 120 to have a common mode level of 1.19 volts with an amplitude of 0.69 volts, resulting in a valley level of 0.5 volts (the target valley level in the example).

Figure 12:
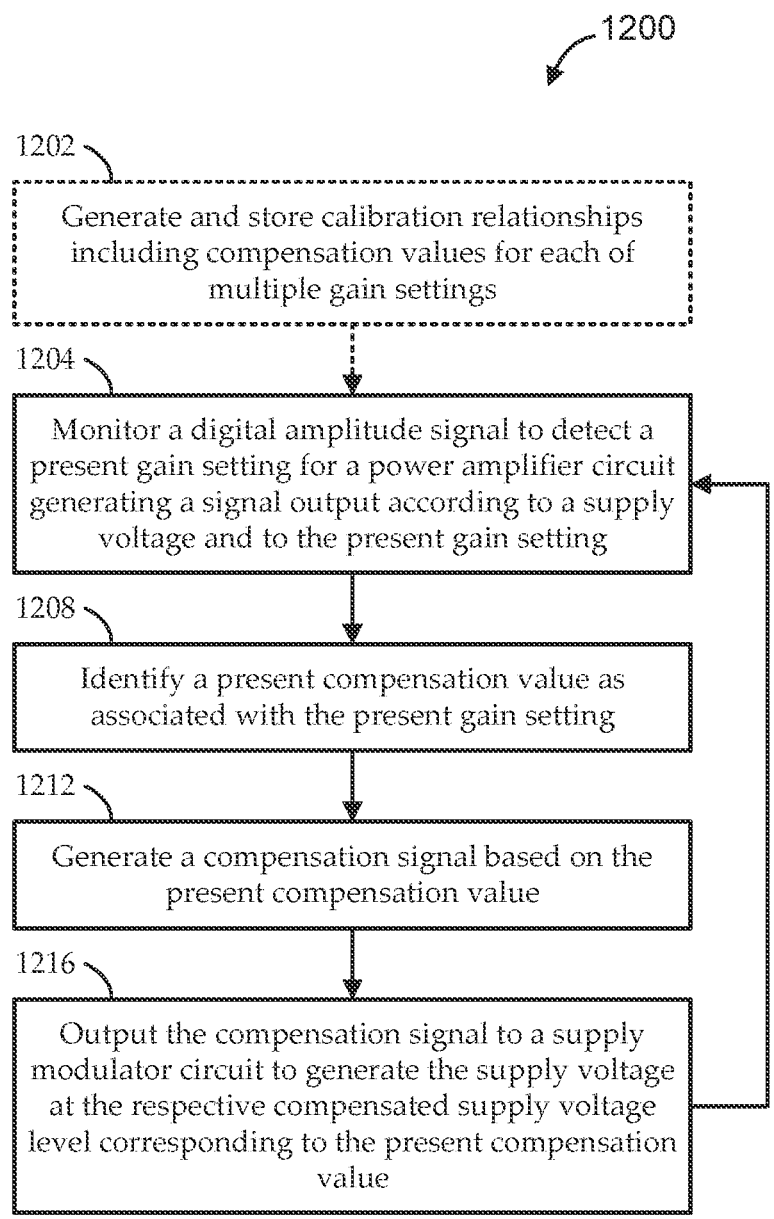
FIG. 12 shows a flow diagram of an illustrative method 1200 for valley compensation in a power amplifier system, according to various embodiments described herein.

FIG. 12 shows a flow diagram of an illustrative method 1200 for valley compensation in a power amplifier system, according to various embodiments described herein. Embodiments of the method 1200 begin at stage 1204 by monitoring a digital amplitude signal to detect a present gain setting of multiple gain settings. The digital amplitude signal is used to amplitude modulate a signal output of a power amplifier circuit. The power amplifier circuit generates the signal output according to a supply voltage and to the present gain setting as indicated by the digital amplitude signal.

At stage 1208, embodiments can identify a present compensation value as associated with the present gain setting. The present compensation value is one of multiple compensation values, each stored by a lookup table in association with a respective one of the gain settings. Each compensation value corresponds to a respective compensated supply voltage level that is calibrated so that setting the supply voltage to the respective compensated supply voltage level when the present gain setting is set to the respective gain setting causes an output valley level of the signal output generated by the power amplifier circuit to be substantially at a predetermined target valley level. For example, the amplitude of the signal output is determined by the gain setting, and a common mode level of the signal output is determined by the compensated supply voltage level, such that the valley level of an envelope of the signal output is substantially at the predetermined target valley level.

At stage 1212, embodiments can generate a compensation signal based on the present compensation value. At stage 1216, embodiments can output the compensation signal to a supply modulator circuit to generate the supply voltage at the respective compensated supply voltage level corresponding to the present compensation value. In some embodiments, each compensation value designates the respective compensated supply voltage level corresponding thereto. In some embodiments, each compensation value designates a difference voltage, such that the reference voltage level less the difference voltage is the respective compensated supply voltage level. In some embodiments, each compensation value designates a digital code corresponding to the respective compensated supply voltage level, and the supply modulator circuit is configured to generate the supply voltage at the respective compensated supply voltage level responsive to receiving the digital code.

Some embodiments continuously cycle through stages 1204-1216 during an operating phase of the power amplifier. As described above, a calibration phase can occur prior to the operating phase. For example, some embodiments begin at stage 1202 by generating and storing calibration relationships including compensation values for each of the multiple gain settings. Some techniques for generating and storing such relationships are described with reference to the method 1300 of FIG. 13.

Figure 13:
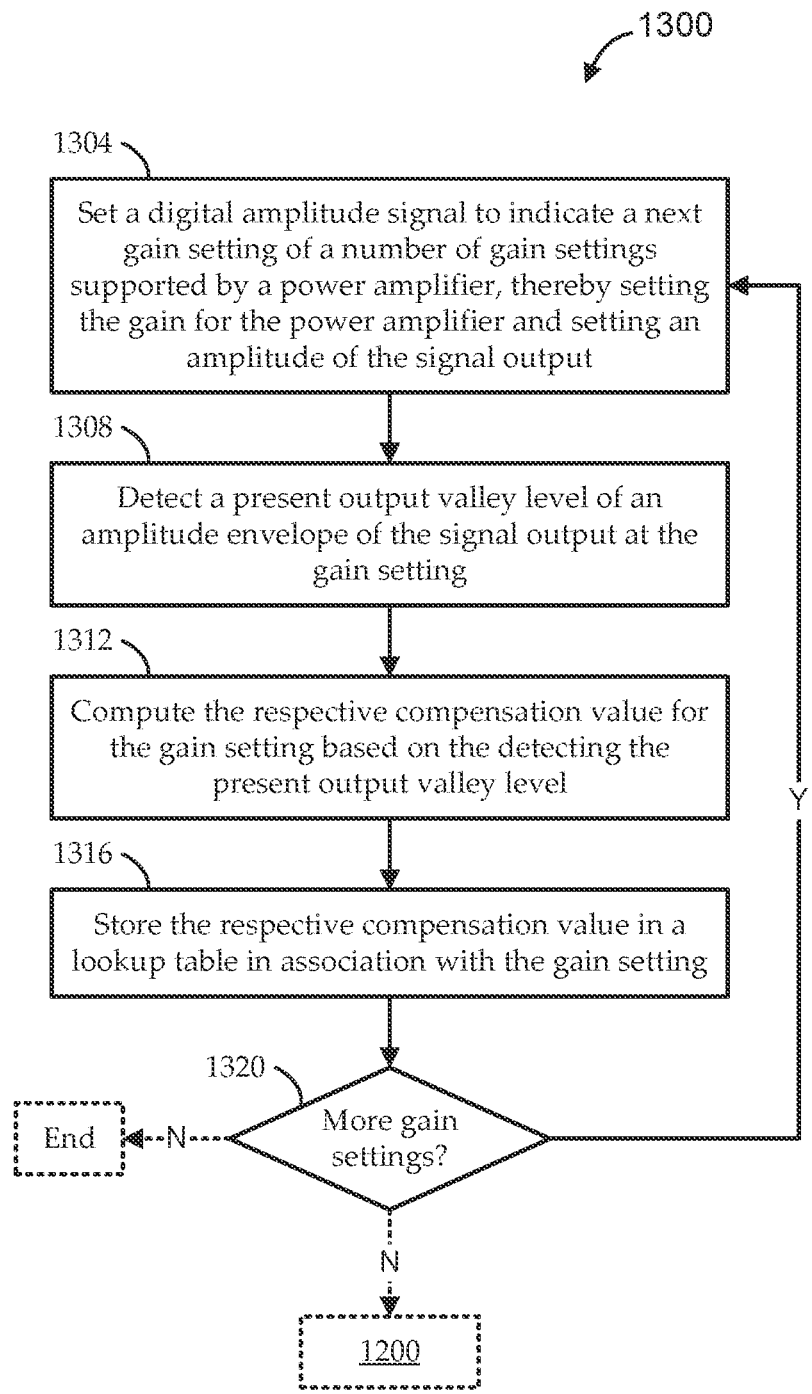
FIG. 13 describes another method for valley compensation in a power amplifier system, according to various embodiments described herein.

FIG. 13 describes another method for valley compensation in a power amplifier system, according to various embodiments described herein. As shown, embodiments of the method 1300 can cycle through stages 1304-1320 for each of a number of gain settings, until calibration relationships have been generated and stored for all of a desired set of gain settings supported by a power amplifier. Each iteration can begin at stage 1304 by setting a digital amplitude signal to indicate the iteration gain setting. The digital amplitude signal can be coupled with a power amplifier circuit configured to generate a signal output from a signal input such that the signal output has an amplitude based on the gain setting and a common mode based on a supply voltage. At stage 1308, embodiments can detect a present output valley level of an amplitude envelope of the signal output at the iteration gain setting.

At stage 1312, embodiments can compute the respective compensation value for the iteration gain setting based on the detecting the present output valley level. The respective compensation value corresponds to a respective compensated supply voltage level that is calibrated, such that setting the supply voltage to the respective compensated supply voltage level with the digital amplitude signal set to the iteration gain setting causes an output valley level of the signal output generated by the power amplifier circuit to be substantially at a predetermined target valley level. In some embodiments, the computing at stage 1312 includes: monitoring a comparison between the present output valley level and the predetermined target valley level; iteratively setting the supply voltage to each of multiple candidate compensated supply voltage levels at the iteration gain setting until the monitoring detects, at one of the candidate compensated supply voltage levels, that the present output valley level is substantially at the predetermined target valley level; and outputting the respective one of the plurality of compensation values for the iteration gain setting based on the one of the candidate compensated supply voltage levels responsive to the monitoring detecting that the present output valley level is substantially at the predetermined target valley level. In some embodiments, a first portion of the compensation values (e.g., k of N compensation values for k of N gain settings) are computed by an iteration of the method 1300, and a second portion of the compensation values (e.g., the remaining N–k compensation values for the remaining N-k gain settings) are computed by applying mathematical operations (e.g., interpolation algorithms, extrapolation algorithms, averaging, etc.) to one or more of the first portion of the compensation values.

At stage 1316, embodiments can store the respective compensation value in a lookup table in association with the iteration gain setting. Each iteration can finish by determining, at stage 1320, whether there are any more gain settings for which to compute a compensation value. If so, a next iteration can be performed for a next remaining gain setting. In some embodiments, if no gain settings remain at stage 1320, the method 1300 can end. In other embodiments, if no gain settings remain at stage 1320, an operating phase can be entered by moving to method 1200 of FIG. 12.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third." etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A power amplifier system comprising:
   a supply modulator circuit to generate a supply voltage at a supply output based at least on a valley level input;
   a digital to analog converter configured to receive a digital amplitude signal and to convert the digital amplitude signal to an analog amplitude signal;
   a power amplifier circuit coupled with the supply output of the supply modulator circuit to receive the supply voltage, having a gain input node to receive the analog amplitude signal, and configured to generate a signal output according to the supply voltage and to one of a plurality of gain settings indicated by the analog amplitude signal; and
   a valley compensator having a lookup table coupled with the valley level input of the supply modulator circuit and configured to output a compensation signal to the valley level input responsive to receiving the digital amplitude signal, such that the compensation signal indicates one of a plurality of compensation values selected based on a present gain setting of the plurality of gain settings indicated by the digital amplitude signal,
   wherein each compensation value is stored by the lookup table in association with a respective gain setting one of the plurality of gain settings, and
   outputting each compensation value to the valley level input directs the supply modulator circuit to output the supply voltage at a respective compensated supply voltage level calibrated, so that applying the respective compensated supply voltage level and the respective gain setting to the power amplifier circuit generates the signal output to have an output valley level substantially at a predetermined target valley level.

2. The power amplifier system of claim 1, wherein each of the plurality of compensation values designates the respective compensated supply voltage level corresponding thereto.

3. The power amplifier system of claim 1, wherein:
   the supply modulator circuit further has a reference voltage input to receive a reference voltage level; and
   each of the plurality of compensation values designates a difference voltage, such that the reference voltage level less the difference voltage is the respective compensated supply voltage level.

4. The power amplifier system of claim 1, wherein:
   each of the plurality of compensation values designates a digital code corresponding to the respective compensated supply voltage level; and
   the supply modulator circuit is configured to generate the supply voltage at the respective compensated supply voltage level responsive to receiving the digital code at the valley level input.

5. The power amplifier system of claim 1, further comprising:
   a second digital to analog converter configured to receive the compensation signal as a digital compensation signal from the valley compensator, to convert the digital compensation signal to an analog compensation signal, and to provide the analog compensation signal to the valley level input of the supply modulator circuit.

6. The power amplifier system of claim 1, wherein:
   the respective compensated supply voltage level for each of the plurality of compensation values is calibrated, so that the power amplifier circuit generates the signal output to have an output valley level substantially at a same predetermined target valley level across all of the plurality of gain settings.

7. The power amplifier system of claim 1, further comprising:
   a calibration subsystem comprising:
      a valley detector circuit having a detection input coupled with the signal output of the power amplifier circuit and configured to generate a detection signal as a function of the detection input, such that the detection signal indicates a present output valley level of an amplitude envelope of the signal output of the power amplifier circuit; and
      a calibration engine coupled with the valley detector circuit and the lookup table and configured, for each gain setting of the plurality of gain settings, to compute a respective one of the plurality of compensation values based on the present output valley level indicated by the detection signal for the gain setting, and to store the respective one of the plurality of compensation values in the lookup table in association with the gain setting.

8. The power amplifier system of claim 7, wherein:
the calibration subsystem further comprises:
a comparator circuit to generate a comparator output based on comparing the detection signal with a valley reference signal that corresponds to the predetermined target valley level; and
the calibration engine is coupled with the valley detector via the comparator circuit and configured, for each gain setting, to compute the respective one of the plurality of compensation values by:
iteratively directing the supply modulator to generate each of a plurality of candidate compensated supply voltage levels at the gain setting while monitoring the comparator output until the comparator output indicates, at one of the candidate compensated supply voltage levels, that the present output valley level is substantially at the predetermined target valley level; and
outputting the respective one of the plurality of compensation values for the gain setting based on the one of the candidate compensated supply voltage levels.

9. The power amplifier system of claim 7, wherein:
the calibration subsystem further comprises:
a selective coupling configured to couple the calibration subsystem with at least the power amplifier circuit during a calibration phase, and to decouple the calibration subsystem from at least the power amplifier circuit during an operating phase.

10. A method for valley compensation in a power amplifier system, the method comprising:
monitoring a digital amplitude signal to detect a present gain setting of a plurality of gain settings, the digital amplitude signal being converted by a digital to analog converter to an analog amplitude signal, the analog amplitude signal used to amplitude modulate a signal output of a power amplifier circuit, the power amplifier circuit generating the signal output according to a supply voltage and to the present gain setting as indicated by the digital amplitude signal;
identifying a present compensation value as associated with the present gain setting, the present compensation value being one of a plurality of compensation values, each stored by a lookup table in association with a respective gain setting of the plurality of gain settings, and each corresponding to a respective compensated supply voltage level that is calibrated so that setting the supply voltage to the respective compensated supply voltage level when the present gain setting is set to the respective gain setting causes an output valley level of the signal output generated by the power amplifier circuit to be substantially at a predetermined target valley level;
generating a compensation signal based on the present compensation value; and
outputting the compensation signal to a supply modulator circuit to generate the supply voltage at the respective compensated supply voltage level corresponding to the present compensation value.

11. The method of claim 10, wherein each of the plurality of compensation values designates the respective compensated supply voltage level corresponding thereto.

12. The method of claim 10, wherein:
each of the plurality of compensation values designates a difference voltage, such that a reference voltage level less the difference voltage is the respective compensated supply voltage level.

13. The method of claim 10, wherein:
each of the plurality of compensation values designates a digital code corresponding to the respective compensated supply voltage level; and
the supply modulator circuit is configured to generate the supply voltage at the respective compensated supply voltage level responsive to receiving the digital code.

14. The method of claim 10, wherein the monitoring the digital amplitude signal, the identifying the present compensation value, the generating the compensation signal, and the outputting the compensation signal are performed during an operating phase, and the method further comprises, during a calibration phase prior to the operating phase:
generating the respective compensation value for each gain setting of at least a portion of the plurality of gain settings by:
setting the digital amplitude signal to indicate the gain setting, such that the power amplifier circuit generates the signal output according to the gain setting;
detecting a present output valley level of an amplitude envelope of the signal output at the gain setting;
computing a respective one of the plurality of compensation values based on the detecting the present output valley level for the gain setting; and
storing the respective one of the plurality of compensation values in the lookup table in association with the gain setting.

15. The method of claim 14, wherein:
the computing the respective one of the plurality of compensation values based on the detecting the present output valley level for the gain setting comprises:
monitoring a comparison between the present output valley level and the predetermined target valley level;
iteratively directing the supply modulator to generate each of a plurality of candidate compensated supply voltage levels at the gain setting until the monitoring detects, at one of the candidate compensated supply voltage levels, that the present output valley level is substantially at the predetermined target valley level; and
outputting the respective one of the plurality of compensation values for the gain setting based on the one of the candidate compensated supply voltage levels responsive to the monitoring detecting that the present output valley level is substantially at the predetermined target valley level.

16. The method of claim 14, wherein the generating the respective compensation value is for each gain setting of a first subset of the plurality of gain settings, and further comprising:
computing the respective compensation value for each gain setting of a second subset of the plurality of gain settings based on at least one of the respective compensation values generated for the first subset of the plurality of gain settings.

17. A method for valley compensation in a power amplifier system, the method comprising:
generating, for each gain setting of at least a portion of a plurality of gain settings, a respective compensation value of a plurality of compensation values by:

setting a digital amplitude signal to indicate the gain setting, the digital amplitude signal converted by a digital to analog converter to an analog amplitude signal, the analog amplitude signal coupled with a power amplifier circuit configured to generate a signal output from a signal input such that the signal output has an amplitude based on the gain setting and a common mode based on a supply voltage;

detecting a present output valley level of an amplitude envelope of the signal output at the gain setting;

computing the respective compensation value for the gain setting based on the detecting the present output valley level, the respective compensation value corresponding to a respective compensated supply voltage level, calibrated such that setting the supply voltage to the respective compensated supply voltage level with the digital amplitude signal set to the gain setting causes an output valley level of the signal output generated by the power amplifier circuit to be substantially at a predetermined target valley level; and storing the respective compensation value in a lookup table in association with the gain setting.

18. The method of claim 17, wherein:

the computing the respective compensation value based on the detecting the present output valley level comprises:

monitoring a comparison between the present output valley level and the predetermined target valley level;

iteratively setting the supply voltage to each of a plurality of candidate compensated supply voltage levels at the gain setting until the monitoring detects, at one of the candidate compensated supply voltage levels, that the present output valley level is substantially at the predetermined target valley level; and outputting the respective one of the plurality of compensation values for the gain setting based on the one of the candidate compensated supply voltage levels responsive to the monitoring detecting that the present output valley level is substantially at the predetermined target valley level.

19. The method of claim 17, wherein the generating the respective compensation value for each gain setting of at least the portion of the plurality of gain settings is during a calibration phase, and further comprising:

maintaining the present output valley level of the amplitude envelope of the signal output substantially at the predetermined target valley level during an operating phase subsequent to the calibration phase by:

monitoring the digital amplitude signal to detect a present gain setting of the plurality of gain settings;

identifying a present compensation value as associated with the present gain setting, the present compensation value being one of the plurality of compensation values stored in the lookup table;

generating a compensation signal based on the present compensation value; and outputting the compensation signal to a supply modulator circuit to generate the supply voltage at the respective compensated supply voltage level corresponding to the present compensation value.

\* \* \* \* \*